United States Patent [19]
Bennett

[11] Patent Number: 4,945,492
[45] Date of Patent: Jul. 31, 1990

[54] APPARATUS AND METHOD FOR DETERMINING NET SECTION PARAMETERS OF TRUSS CONNECTOR PLATES

[75] Inventor: Janice M. Bennett, Grand Prairie, Tex.

[73] Assignee: Truswal Systems Corporation, Arlington, Tex.

[21] Appl. No.: 292,420

[22] Filed: Dec. 30, 1988

[51] Int. Cl.$^5$ .............................................. H04N 7/18
[52] U.S. Cl. ...................................... 364/512; 364/508; 340/665; 340/668; 403/27; 73/760; 73/786
[58] Field of Search ............... 364/506, 508, 512, 550; 340/665, 666, 668; 403/27; 73/786, 787, 760, 763

[56] References Cited

U.S. PATENT DOCUMENTS

| | | | |
|---|---|---|---|
| 4,366,874 | 1/1983 | Pidoux et al. | 364/508 |
| 4,433,581 | 2/1984 | Scott et al. | 364/508 |
| 4,550,376 | 10/1985 | Maciesczak | 364/512 |
| 4,757,461 | 7/1988 | Stöhr et al. | 364/512 |
| 4,789,947 | 12/1988 | Maciejczak | 364/512 |

Primary Examiner—Parshotam S. Lall
Assistant Examiner—Brian M. Mattson
Attorney, Agent, or Firm—W. Kirk McCord

[57] ABSTRACT

Net section parameters of connector plates at selected truss joints are determined by representing each wood member as a corresponding two-dimensional polygon and the connector plate as a rectangle of predetermined dimensions corresponding to the actual dimensions of the plate. When the plate is positioned at a particular truss joint, the area of intersection between the plate rectangle and the polygon defines an intersection polygon. The intersection polygon is rotated and the Cartesian coordinate system of the intersection polygon is redefined so that a first axis thereof is aligned with a central major axis extending along a geometric center of a major surface of the particular wood member. The maximum and minimum coordinates of the intersection polygon along a second axis of the redefined coordinate system, which is perpendicular to the first axis thereof, are added together to determine the length of overlap of the connector plate along an axis perpendicular to the central major axis of the wood member, thereby defining the net section parameter of the corresponding wood member.

4 Claims, 5 Drawing Sheets

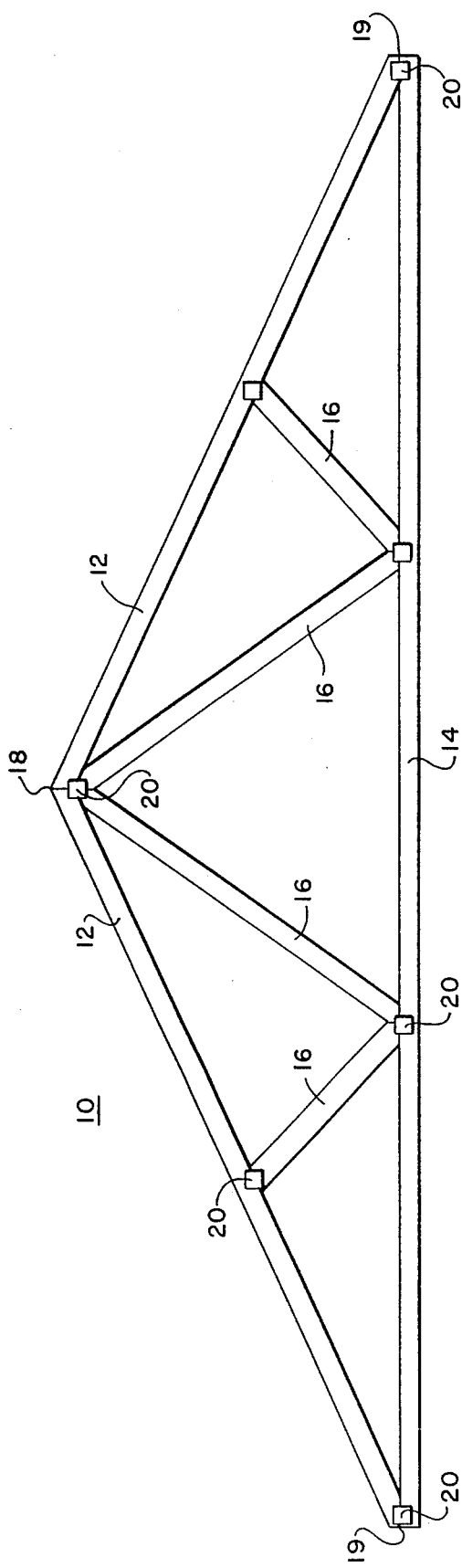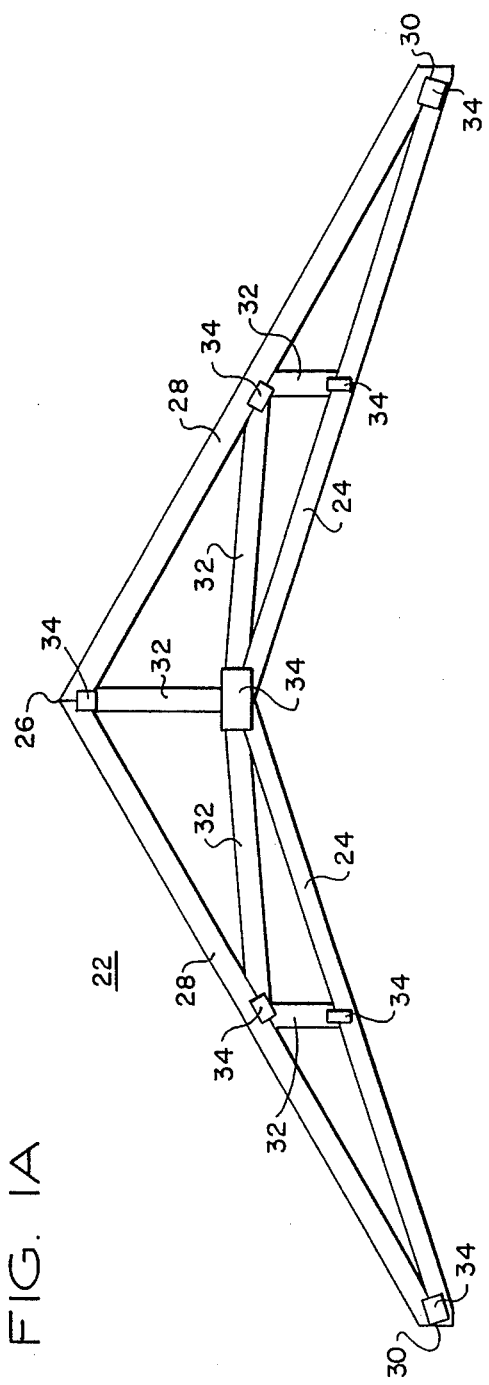
FIG. 1A
FIG. 1B

CHECK AREA AND
REDUCED NET SECTION

4,945,492

APPARATUS AND METHOD FOR DETERMINING NET SECTION PARAMETERS OF TRUSS CONNECTOR PLATES

FIELD OF THE INVENTION

The present invention relates to wood trusses used in building construction and in particular to an apparatus and method for determining net section parameters of metal connector plates at the respective joints of the wood truss.

BACKGROUND OF THE INVENTION

A conventional truss is typically comprised of top and bottom chords, a plurality of web members extending between the top and bottom chords and a plurality of metal toothed connector plates for securing the ends of each web member to the top and bottom chords, thereby completing the fabrication of the truss. It is critical that these metal connector plates be properly positioned and attached at the joints between the web members and chords in order to provide the necessary structural strength and integrity.

DESCRIPTION OF THE PRIOR ART

According to prior practice, computer software programs are often used to assist the truss designer in the selection and placement of the connector plates. Once the truss is engineered to determine the size and shape threreof, each joint is analyzed to determine the proper size connector plate to be used and the proper position of the connector plate on the joint. Using an iterative process, different sized connector plates can be tested to find a proper connector plate for each truss joint based upon selected parameters applicable to that joint. The plate is positioned within the outermost boundaries of the truss and selected parameters, such as the area overlap of the plate on the joint members and shear and tension stresses on the joint members, are tested to determine whether the particular connector plate is suitable for that joint.

The position of the connector plate on the joint is determined by first placing the geometric center of the plate coincident with the predetermined geometric center of the joint and checking the point coordinates (based upon a reference Cartesian coordinate system) of each of the four corners of the rectangular plate to determine whether any of the four corners of the plate is outside of the outer boundary of the joint. The plate is then moved accordingly to position the plate within the outer boundary of the joint.

One problem associated with this prior art technique is that only the outer boundaries of the truss are considered and not the inner boundaries thereof. For example, in the case of trusses used in building attics, the connector plates may not be able to extend beyond the inner boundaries of the truss. Another problem with prior art placement techniques is that "non-standard" joints are often modeled by "standard" joints, which are based upon an estimation of the shape of the joint and not upon the actual shape thereof. For example, the estimated shape of the joint may be based upon an assumed number of cuts in the joint members, but the actual shape of the joint may involve a different number of cuts and hence a different shape from that estimated, thereby leading to errors in the placement of the plates.

It is also difficult using prior art techniques to accurately determine area of overlap and net section parameters of the plate on the joint not only because the shape of the joint members is not always well-defined, but also because it is difficult to determine the positions of the corners of the rectangular plate after the plate is superimposed on the joint members. These parameters are usually estimated, which often leads to significant errors.

OBJECTS OF THE INVENTION

It is, therefore, the principal object of the present invention to provide an improved apparatus and method for determining net section parameters of metal connector plates in a wood truss.

Another object of the invention is to provide an apparatus and method by which net section parameters of the connector plates on a truss joint can be accurately determined for truss joints of various shapes and sizes.

SUMMARY OF THE INVENTION

These and other objects are accomplished in accordance with the present invention wherein an apparatus and method for determining net section parameters of truss connector plates is provided. After a connector plate is positioned at a particular truss joint, which represents the intersection of two or more wood members of the truss, the net section parameters of that particular plate are determined by measuring the respective lengths of overlap of the plate on the individual wood members of the joint. The respective lengths of overlap are determined by the steps of: (1) establishing a Cartesian coordinate system, the origin of which corresponds to a predetermined reference point on the joint; (2) representing each wood member as a corresponding two dimensional polygon, each side of which is defined by a corresponding member vector; (3) representing the connector plate as a rectangle of predetermined dimensions corresponding to the actual dimensions of the plate, each side of the rectangle being defined by a corresponding one of a plurality of plate vectors; (4) selecting a particular one of the wood members and determining the area of intersection of the rectangle with the polygon defined by the particular wood member, the area of intersection defining an intersection polygon; (5) rotating the intersection polygon and redefining the Cartesian coordinate system of the intersection polygon so that a first axis thereof is aligned with the central major axis extending along the approximate geometric center of a major surface of the particular wood truss member; and (6) measuring the maximum and minimum coordinates of the intersection polygon along the second axis of the redefined coordinate system, which is perpendicular to the first axis thereof, and adding the values of the maximum and minimum coordinates to determine the total length of overlap of the connector plate along an axis perpendicular to the central major axis of the particular wood member.

The stress acting on the particular wood member is computed by dividing the force acting along the central major axis of the corresponding wood member by the product of the sum of the corresponding minimum and maximum coordinates along the second axis and the thickness of the wood member, as measured along an axis which is perpendicular to the major surface of the wood member. The computed stress is compared with a predetermined maximum allowable stress to determine whether the net section parameter for that particular wood member has been met. Steps (4), (5), and (6) set forth above are repeated for each wood member of the joint to determine the length of overlap of the plate along an axis perpendicular to the corresponding central axis of each wood member and the stress acting in each wood member is computed as set forth above to determine the net section parameter of the plate on each wood member of the joint.

BRIEF DESCRIPTION OF THE DRAWINGS

Other objects and advantages of the invention will be apparent from the detailed description and claims when read in conjunction with the accompanying drawings wherein:

FIGS. 1A and 1B are respective elevation views of first and second embodiments of a wood truss with metal connector plates attached at the respective joints of the truss;

DETAILED DESCRIPTION OF THE PREFERRED EMBODIMENT

Figure 2:
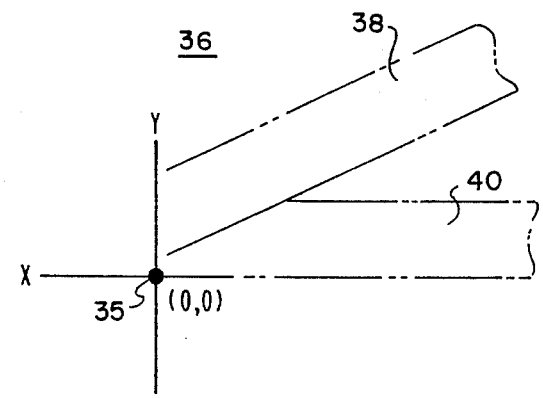
FIG. 2 is a sectional view of a heel joint of a truss, illustrating the establishment of a Cartesian coordinate system for reference purposes.

In the description which follows like parts are marked throughout the specification and drawings, respectively. The drawings are not necessarily to scale and in some instances proportions have been exaggerated in order more clearly depict certain features of the invention.

Referring to FIG. 1A, a conventional roof truss 10 is depicted. Truss 10 is comprised of a top chord 12, a bottom chord 14 and a plurality of web members 16 interconnecting top and bottom chords 12 and 14. Top chord 12 is comprised of two wood members, respective first ends of which intersect at an obtuse angle to define apex 18 of truss 10. The respective second ends of the two wood members, opposite from the respective first ends thereof, intersect bottom chord 14 at respective opposite sides of truss 10 to define respective heel joints 19. The intersections between web members 16 and top and bottom chords 12 and 14 also define respective joints on truss 10. Toothed metal connector plates 20 are disposed at predetermined positions on the corresponding truss joints to hold the wood members in position and provide structural integrity for truss 10.

Referring to FIG. 1B, another embodiment of a roof truss is depicted. Truss 22 is similar to truss 10 except that bottom chord 24 is also comprised of a pair of wood members, respective first ends of which intersect at an obtuse angle below apex 26 of truss 22 so that truss 22 defines a vaulted structure, such as that frequently used in attic areas. The intersection of respective first ends of the two members comprising top chord 28 defines apex 26. Respective second ends of the wood members comprising top chord 28, opposite from the respective first ends thereof, intersect corresponding second ends of the wood members comprising bottom chord 24 to define respective heel joints 30 on opposite sides of trus 22. Wooden web members 32 interconnect top and bottom chords 28 and 24. One skilled in the art will recognize that web members 32 are oriented differently from web members 16 of truss 10, but that their function is substantially the same. Toothed metal connector plates 34 are disposed at predetermined positions on the truss joints to secure the joints as previously described.

Area overlap and net section parameters for a connector plate at a truss joint is determined according to a computer-based routine, as described below with reference to FIG. 7.

Figure 3:
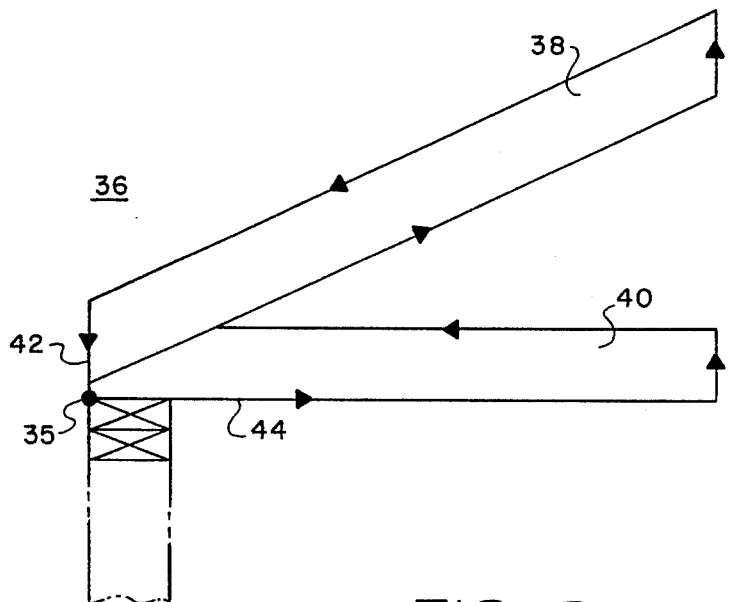
FIG. 3 is a sectional view of the heel joint illustrated in FIG. 2, which shows the individual members of the truss joint being defined by a plurality of vectors rotating in a counterclockwise direction around each of the members.

Referring to FIGS. 2 and 3, a Cartesian coordinate system is established having a point of origin (0,0), indicated at 35, which corresponds to a predetermined reference point on the truss. In FIG. 2, the origin point is at the lower left edge of the truss, which corresponds to the center of left heel joint 36 depicted in FIG. 2. Heel joint 36 is defined by the intersection of respective ends of diagonally oriented top chord 38 and horizontal bottom chord 40. The X-axis runs horizontally along the bottom edge of bottom chord 40 and the Y-axis runs vertically along the left side of heel joint 36. As shown in FIG. 3, top and bottom chords 38 and 40 are represented by corresponding polygons, the respective perimeters of which are defined by respective member vectors. As indicated by the arrows in FIG. 3, the member vectors define a counterclockwise rotation around the corresponding polygon. The joint boundaries in this example are defined by vector 42 extending along the left side of joint 36 and vector 44 extending along the bottom edge of joint 36.

Figure 4:
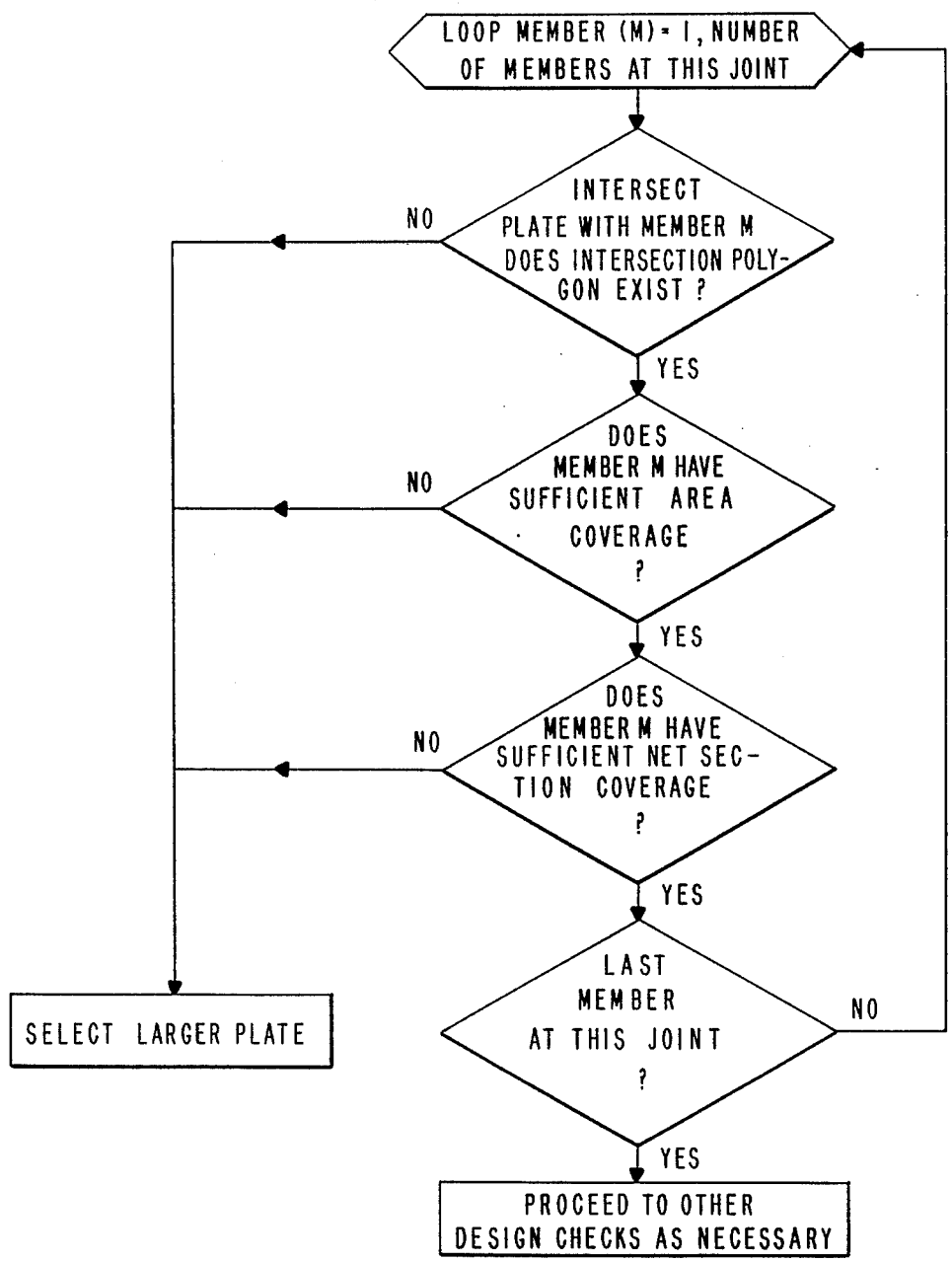
FIG. 4 is a flow diagram illustrating the system and method for determining net section parameters of a connector plate at a corresponding truss joint in accordance with the present invention.
Figure 5A:
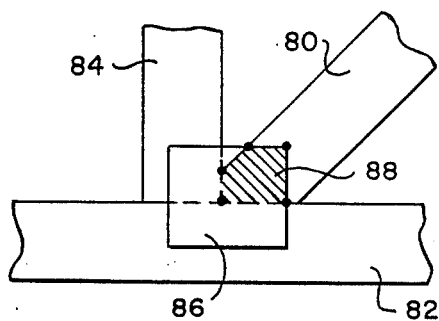
FIGS. 5A and 5B are respective sectional views of an interior truss joint, illustrating the determination of the area of overlap of the connector plate on one of the members of the joint.
Figure 5B:
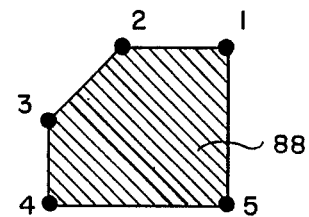

Referring to FIGS. 4, 5A and 5B, the area of overlap of a connector plate on each of the wood members of a particular truss joint is determined and compared with the minimum area overlap acceptable for that joint. Each of the wood members of the joint is assigned a sequential number and the routine begins with the first wood member. The perimeter of a major surface of each wood member is defined by corresponding member vectors and the plate perimeter is defined by corresponding plate vectors, as described previously. Once the plate is properly positioned on the joint, the program determines whether a rectangle representing the connector plate intersects the polygon representing the first wood member of the joint. If no intersection exists, there is no area of overlap between the connector plate and the particular wood member, which necessitates the selection of a larger plate. If an intersection exists, the program determines the location of the area of intersection between the rectangle and the first wood member by determining the coordinates of the points of intersection between the plate vectors and the corresponding member vectors. The area of intersection is defined by a polygon, which represents the area overlap of the connector plate on the first wood member.

For example, in FIGS. 5A and 5B, an interior truss joint 78 is depicted in which a first web member 80 intersects bottom chord 82 diagonally, and a second web member 84 intersects bottom chord 82 substantially at right angles. The overlap of rectangle 86 on first web member 80 defines a substantially trapezoidal shaped polygon 88 with five sides and five corner points 1,2,3,4 and 5. The area of polygon 88 determines the area overlap parameter.

The area of polygon 88 is arrived at by solving the following equation known as Green's Theorem for the area of a polygon given an ordered set of X and Y coordinates:

$$A = \sum_{i=1}^{n} (Yi + 1 - Yi)(Xi + 1 + Xi)/2$$

where A is the area of polygon 88, n is the number of corner points of polygon 88 (in this example, n=5), and Xi, Yi are the Cartesian coordinates of the ith corner point of polygon 88. The equation involves multiplying the difference between the Y-coordinates of each pair of adjacent corner points by the sum of the X-coordinates of each pair of adjacent corner points, dividing the product by 2, and then summing the results for all n pairs of corner points. In the example illustrated by FIGS. 5A and 5B, corner point 1 will also be corner point 6 so that the calculations using Green's Theorem will proceed counterclockwise around polygon 88, beginning with corner points 1 and 2 and ending with corner points 5 and 6 (same as 1).

The computed area of polygon 88 is compared with the predetermined parameter representing the minimum area overlap which is acceptable for that particular wood member of the joint. If the computed area overlap exceeds the minimum acceptable area overlap, then first web member 80 is determined to have sufficient area coverage by that particular connector plate represented by rectangle 86 and the next parameter, namely net section coverage, will be checked. If the area overlap falls short of the minimum acceptable area overlap, a larger plate is selected and the process will begin anew with respect to the new plate.

Figure 6A:
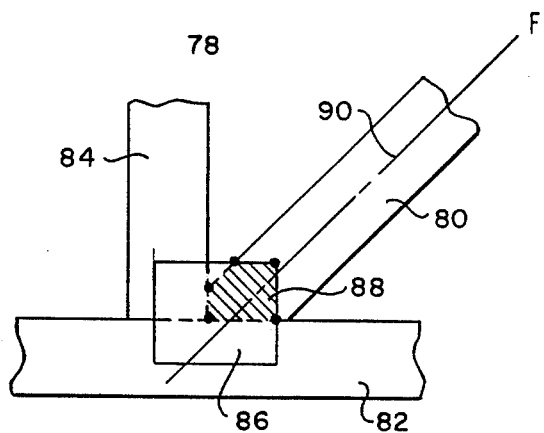
FIGS. 6A–6C are respective sectional views illustrating the determination of the net section check parameter of the connector plate with respect to one of the joint members.
Figure 6B:
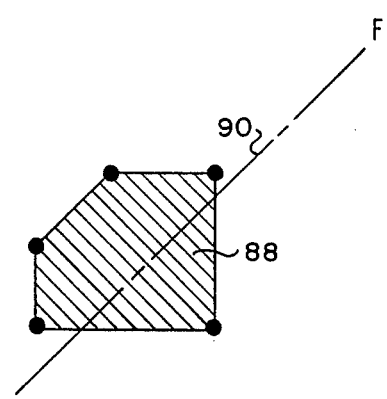
Figure 6C:
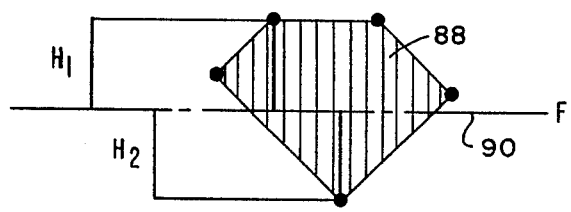

Net section coverage is illustrated by FIGS. 6A and 6B. The net section coverage check involves a determination of whether the connector plate provides sufficient overlap coverage along an axis which is perpendicular to the line of force acting along a major axis of a particular wood member of a truss joint to prevent the plate from pulling out of the joint. This parameter is dependent upon the type of lumber being used and the design of the joint rather than upon the type of plate being used. As depicted in FIG. 4, once the area overlap parameter has been satisfied for web member 80, the net section check is performed for web member 80 using the same intersection polygon 88 except that intersection polygon 88 is rotated to redefine the Cartesian coordinate system thereof so that the X-axis is aligned with central major axis 90 of web member 80, which extends along the approximate geometric center of a major surface of web member 80. The Y-axis of the rotated coordinate system is oriented perpendicularly with respect to central major axis 90 of web member 80. As shown in FIG. 6C, the maximum (H1) and the minimum (H2) coordinates of intersection polygon 88 along the Y-axis are determined and are added together to determine the total length of overlap of rectangle 86 on web member 80. The stress acting on web member 80 tending to dislodge the plate from web member 80 is computed according to the following equation:

$$S = F/(H1 + H2) \times Z$$

where S is the stress acting on the member, F is the force acting along central major axis 90 in the member and Z is the thickness of the member, measured along an axis which is perpendicular to the major surfaces of the member.

The computed stress is then compared with the maximum allowable stress for that member. If the computed stress is less than the maximum allowable stress, the net section parameter is satisfied. Otherwise, sufficient net section coverage is not available, and a larger plate must be selected. The area overlap and the net section coverage are determined for each web member of the joint. The chosen connector plate must satisfy the applicable parameters for each joint member. Otherwise, the plate is discarded in favor of a larger plate.

When all of the applicable parameters are satisfied for a particular plate, the plate information, including the identification of the plate and the position thereof on the joint, is stored in the system memory. The program then moves to the next joint in sequence, and the aforementioned procedure and checks are repeated with respect to the next joint. When all of the truss joints have been properly plated, the task is completed and the truss can be assembled according to specifications.

Figure 7:
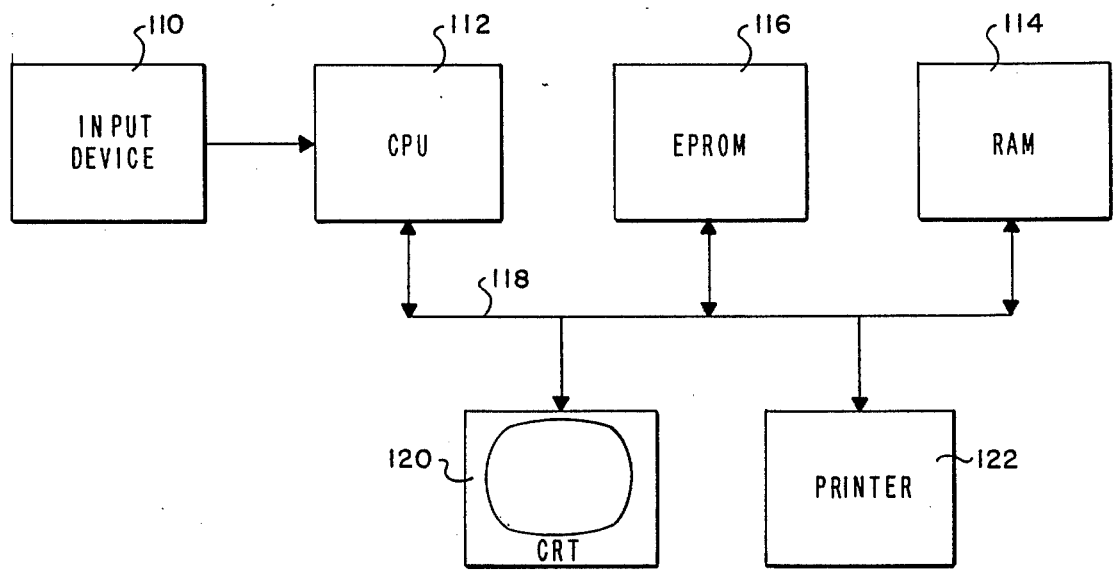
FIG. 7 is a block diagram of a computer system for executing the preferred embodiment of the method for determining net section parameters of a connector plate at a corresponding truss joint in accordance with the present invention.

Referring to FIG. 7, the program routine described above is preferably implemented in connection with a digital computer system, such as a personal computer having a DOS-based operating system. Truss profile information, including the span of the truss, the truss pitch and the respective positions of the web members connecting the top and bottom truss chords to define the respective truss joints, are entered by a user via an input device 110, such as a keyboard, into a central processing unit (CPU) 112. CPU 112 loads the input data into a random access memory (RAM) 114. A storage device, such as an erasable programmable read only memory (EPROM) 116, is provided for storing the program. One skilled in the art will appreciate that the program could be stored on other media, such as on a hard disk or on magnetic tape, in lieu of EPROM 16. The program contains instructions for controlling CPU 112 to perform the various routines described above. EPROM 116 has a permanent data base stored therein, which defines the corresponding reference parameters for each truss joint and selected characteristics of the connector plates to be tested.

CPU 112 communicates with RAM 114 and EPROM 116 via a data bus 118. To initialize the program, CPU 112 will address EPROM 116, whereupon the program instructions will be executed to control CPU 112. In response to the program instructions, CPU 112 will establish the boundary vectors corresponding to the truss profile information entered by the user and will execute the program steps described above. A standard graphics program may be provided for displaying the truss joint with the connector plate superimposed thereon on an electronic display, such as a cathode ray tube (CRT) display 120. A printer 122 can also be provided for a hard copy printout.

Various embodiments of the invention have now been described in detail. Since it is obvious that many changes in and additions to the above-described preferred embodiment may be made without departing from the nature, spirit and scope of the invention, the invention is not to be limited to the details, except as set forth in the appended claims.

What is claimed is:

1. A method of determining respective lengths of overlap of a connector plate on individual wood members of a corresponding truss joint, wherein a Cartesian coordinate system having an origin corresponding to a predetermined reference point on the joint is established and each wood member is represented by a corresponding two-dimensional polygon, each side of which is defined by a corresponding member vector, each of said member vectors having starting and ending points expressed in Cartesian coordinates relative to the reference point, said method comprising the steps of:

representing the plate as a corresponding rectangle, each side of which is defined by a corresponding plate vector, each of said plate vectors having starting and ending points expressed in Cartesian coordinates relative to the reference point;

selecting a particular one of the wood members and determining an area of intersection of the rectangle with the polygon defined by the particular wood member, said area of intersection defining an intersection polygon;

rotating the intersection polygon and redefining the Cartesian coordinate system of the intersection polygon, so that a first axis thereof is aligned with a central major axis extending along a geometric center of a major surface of a particular wood truss member;

measuring maximum and minimum coordinates of the intersection polygon along a second axis of the redefined coordinate system, which is perpendicular to the first axis thereof, and adding the maximum and minimum coordinates to determine the length of overlap of the connector plate along an axis perpendicular to the central major axis of the particular wood member; and repeating the immediately preceding three steps with respect to each wood member of the joint to determine the length of overlap of the plate along an axis perpendicular to the corresponding central major axis of each wood member.

2. The method according to claim 1 further including the steps of determining a stress factor in each wood member by computing a magnitude of a force acting along the central major axis of the corresponding wood member and dividing the magnitude of the force by a product of the length of overlap of the connector plate along the second axis and a value representing thickness of the wood member, as measured along an axis perpendicular to the major surface of the wood member, and comparing the stress factor with a predetermined maximum allowable stress factor to determine whether the connector plate meets criteria prescribed for that particular wood member.

3. In a data processing system, an apparatus for determining respective lengths of overlap of a connector plate on individual wood members of a corresponding truss joint, wherein a Cartesian coordinate system having an origin corresponding to a predetermined reference point on the joint is established and each wood member is represented by a corresponding two-dimensional polygon, each side of which is defined by a corresponding member vector, each of said member vectors having starting and ending points expressed in Cartesian coordinates relative to the reference point, said apparatus comprising:

data processing means;

input means coupled to said processing means for entering selected truss parameters into the system;

memory means coupled to said processing means for storing said selected truss parameters, said memory means having a predetermined set of program instructions stored therein;

said data processing means being responsive to said truss parameters for determining respective lengths of overlap of the plate on individual wood members of the truss joint according to said program instructions by the following steps:

representing the plate as a corresponding rectangle, each side of which is defined by a corresponding plate vector, each of said plate vectors having starting and ending points expressed in Cartesian coordinates relative to the reference point;

selecting a particular one of the wood members and determining an area of intersection of the rectangle with the polygon defined by the particular wood member, said area of intersection defining an intersection polygon;

rotating the intersection polygon and redefining the Cartesian coordinate system of the intersection polygon, so that a first axis thereof is aligned with a central major axis extending along a geometric center of a major surface of a particular wood truss member;

measuring maximum and minimum coordinates of the intersection polygon along a second axis of the redefined coordinate system, which is perpendicular to the first axis thereof, and adding the maximum and minimum coordinates to determine the length of overlap of the connector plate along an axis perpendicular to the central major axis of the particular wood member; and repeating the immediately preceding three steps with respect to each wood member of the joint to determine the length of overlap of the plate along an axis perpendicular to the corresponding central major axis of each wood member.

4. The method according to claim 3 wherein said data processing means includes means for determining a stress factor in each wood member by computing a magnitude of a force acting along the central major axis of the corresponding wood member and dividing the magnitude of the force by a product of the length of overlap of the connector plate along the second axis and a value representing thickness of the wood member, as measured along an axis perpendicular to the major surface of the wood member, and comparing the stress factor with a predetermined maximum allowable stress factor to determine whether the connector plate meets criteria prescribed for that particular wood member.

* * * * *